(12) United States Patent
Mourrier et al.

(10) Patent No.: US 11,888,305 B2
(45) Date of Patent: Jan. 30, 2024

(54) WIRE INTEGRITY CHECK

(71) Applicant: Infineon Technologies AG, Neubiberg (DE)

(72) Inventors: Andre Mourrier, Manosque (FR); Thomas Blasius, Haar (DE)

(73) Assignee: Infineon Technologies AG, Neubiberg (DE)

( * ) Notice: Subject to any disclaimer, the term of this patent is extended or adjusted under 35 U.S.C. 154(b) by 122 days.

(21) Appl. No.: 17/201,818

(22) Filed: Mar. 15, 2021

(65) Prior Publication Data

US 2021/0359504 A1 Nov. 18, 2021

(30) Foreign Application Priority Data

May 14, 2020 (DE) .......................... 102020113122.4

(51) Int. Cl.
*H02H 3/08* (2006.01)
*G01R 31/00* (2006.01)
*G01R 31/58* (2020.01)
*G01R 19/165* (2006.01)
*H01B 7/00* (2006.01)
*B60R 16/02* (2006.01)

(52) U.S. Cl.
CPC ......... *H02H 3/08* (2013.01); *G01R 19/16571* (2013.01); *G01R 31/006* (2013.01); *G01R 31/58* (2020.01); *H01B 7/0045* (2013.01); *B60R 16/0207* (2013.01)

(58) Field of Classification Search
CPC ............ H02H 3/20; H02H 3/006; H02H 3/08; H02H 7/226; G01R 19/16571; G01R 31/006; G01R 31/58; G01R 27/08; G01R 27/2611; H01B 7/0045; B60R 16/0207
See application file for complete search history.

(56) References Cited

U.S. PATENT DOCUMENTS

| | | | | |
|---|---|---|---|---|
| 6,442,498 | B1 * | 8/2002 | Krigel .................... | G01R 31/58 702/108 |
| 2007/0252584 | A1 * | 11/2007 | Imamura ............... | H02J 7/0029 320/104 |
| 2009/0147424 | A1 * | 6/2009 | Vicente .................. | H02H 3/006 361/93.2 |
| 2010/0265051 | A1 * | 10/2010 | Sivertsen ............... | B60L 58/21 340/438 |

(Continued)

FOREIGN PATENT DOCUMENTS

| | | | |
|---|---|---|---|
| CN | 105048425 A | * | 11/2015 |
| GB | 2246868 A | | 2/1992 |
| JP | H09257860 A | * | 10/1997 |

*Primary Examiner* — Daniel R Miller
(74) *Attorney, Agent, or Firm* — Shumaker & Sieffert, P.A.

(57) ABSTRACT

A method is disclosed. The method includes measuring at least one electrical parameter (R, L, C) of at least one wire (10) in a motor vehicle (100) at a certain time instance ($t_i$) to obtain measurement data ($M(t_i)$); comparing the measurement data ($M(t_i)$) with comparative data ($C(t_i)$) held in a data storage (5); and taking a predefined action (63) dependent on the comparing.

18 Claims, 14 Drawing Sheets

(56) References Cited

U.S. PATENT DOCUMENTS

2011/0015823 A1* 1/2011 Bertosa .................. G07C 5/008
 701/31.4
2015/0280425 A1* 10/2015 Kreuter .................. H02H 3/006
 361/93.1

* cited by examiner $$M(t_i) = \begin{pmatrix} R_1(t_i) & L_1(t_i) & C_1(t_i) \\ R_2(t_i) & L_2(t_i) & C_2(t_i) \\ & \vdots & \\ R_N(t_i) & L_N(t_i) & C_N(t_i) \end{pmatrix}$$

$$K(t_i) = \begin{pmatrix} KR_1(t_i) & KL_1(t_i) & KC_1(t_i) \\ KR_2(t_i) & KL_2(t_i) & KC_2(t_i) \\ & \vdots & \\ KR_N(t_i) & KL_N(t_i) & KC_N(t_i) \end{pmatrix}$$

WIRE INTEGRITY CHECK

This Application claims priority to German Patent Application Number 102020113122.4, filed May 14, 2020, the entire content of which is incorporated herein by reference.

This disclosure relates in general to a method for checking for the integrity of a wire, in particular a wire of a wire harness in a motor vehicle, such as a car.

A wire harness in a modern car may include a significant number of wires each coupled between a power source and a respective load. Over the time, one or more electrical parameters of the wires may change due to aging. Examples of electrical parameters that may change include a resistance, an inductance, or a capacitance of a respective wire. A change of one or more of these parameters may have a negative impact on a proper function. An increase of the wire resistance, for example, may result in a higher power dissipation at a given current and, therefore, a higher temperature of the wire.

It is therefore desirable to check for the integrity of a wire in a motor vehicle during use.

One example relates to a method. The method includes measuring at least one electrical parameter of at least one wire in a motor vehicle at a certain time instance to obtain measurement data, comparing the measurement data with comparative data held in a data storage, and taking a predefined action dependent on the comparing.

Examples are explained below with reference to the drawings. The drawings serve to illustrate certain principles, so that only aspects necessary for understanding these principles are illustrated. The drawings are not to scale. In the drawings the same reference characters denote like features.

FIG. 1 schematically illustrates a motor vehicle and a wire included in the motor vehicle;

FIG. 2 schematically illustrates a vehicle electrical system that includes a plurality of wires;

Figures 5, 6A, 6B:
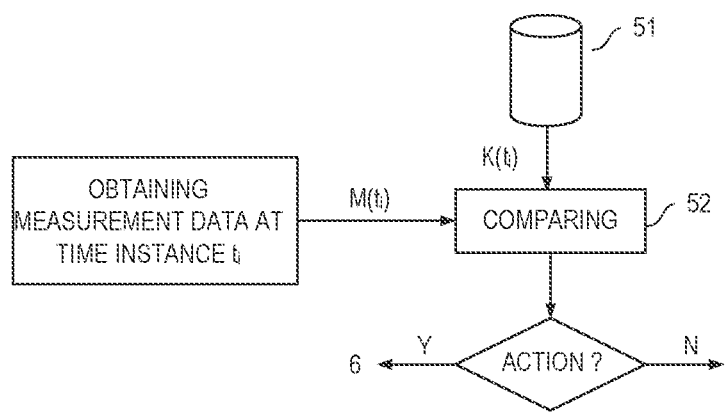
Figure 7:
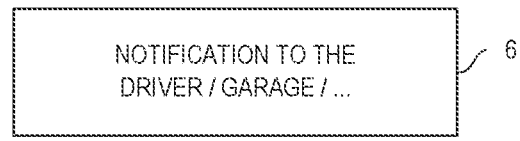
Figure 8:
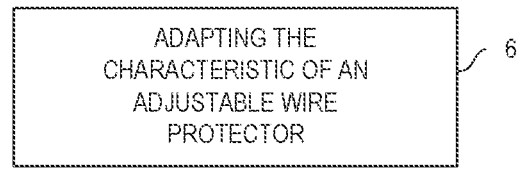
Figure 9:
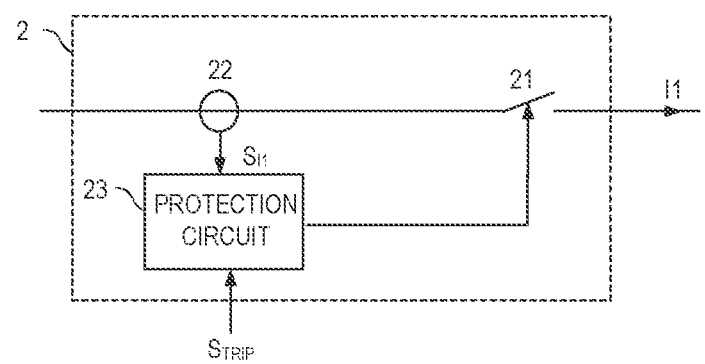
Figure 10A:
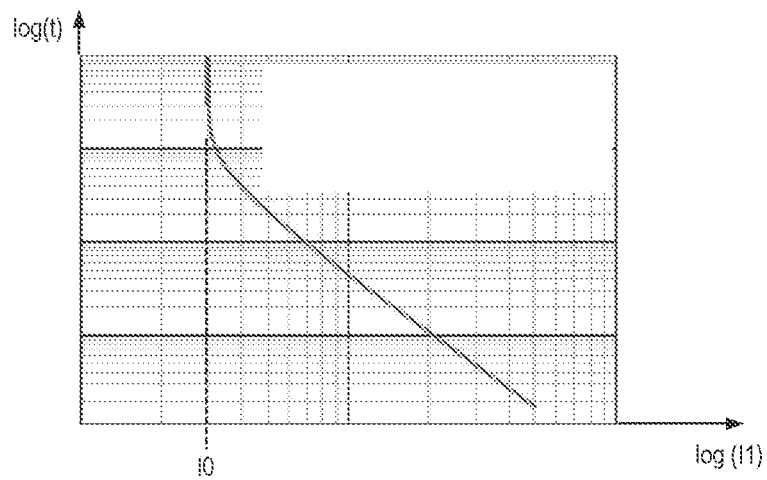
Figure 10B:
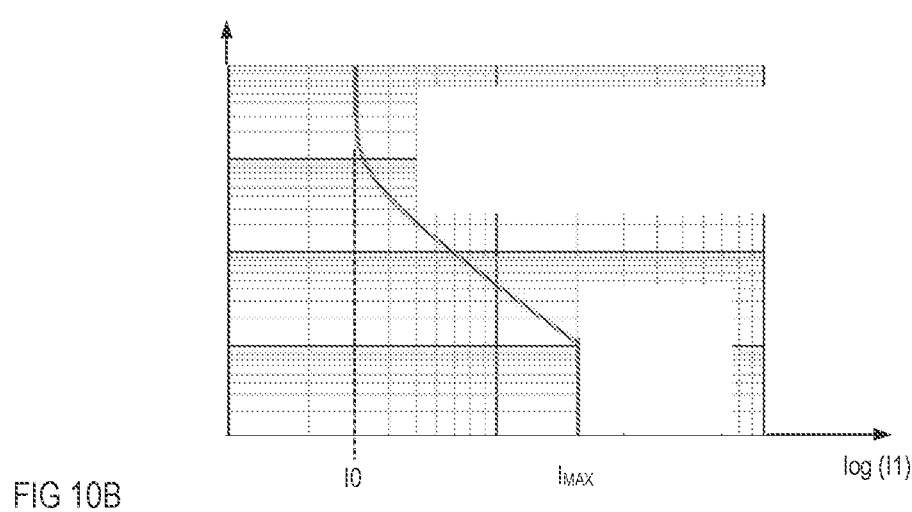
Figure 11:
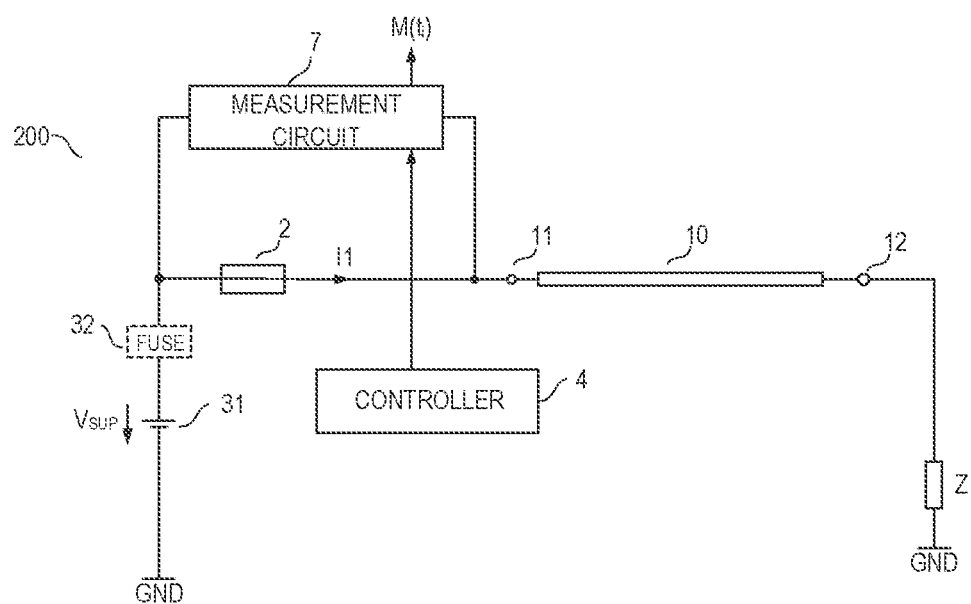
Figure 12:
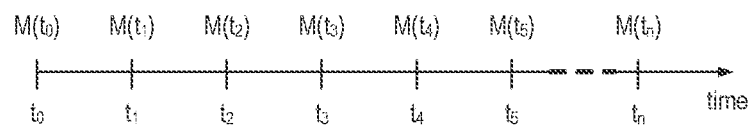
Figure 13:
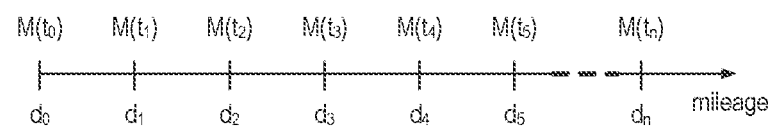
Figure 14A:
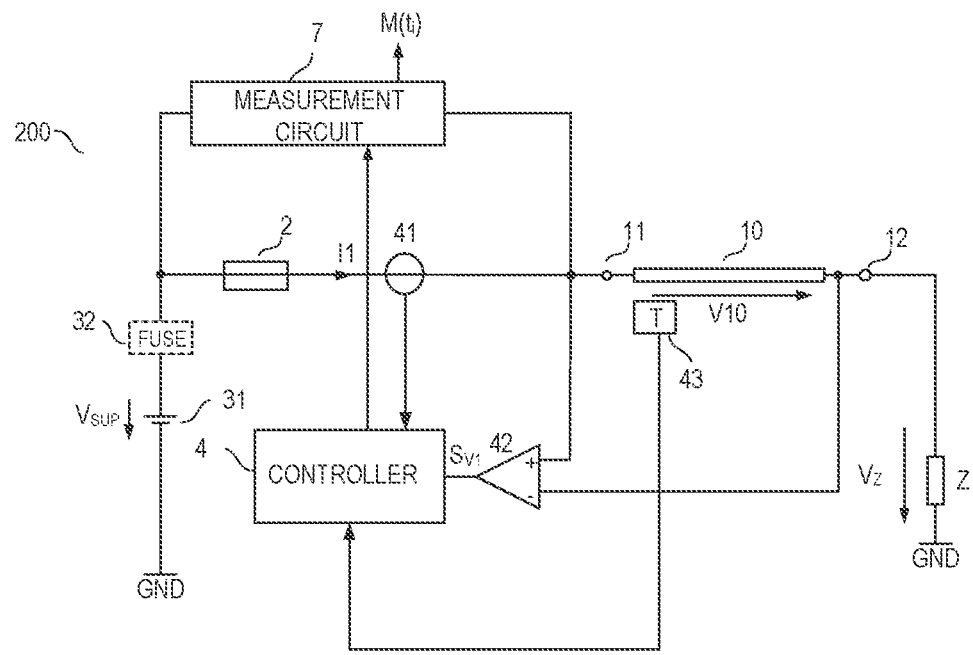
Figure 14B:
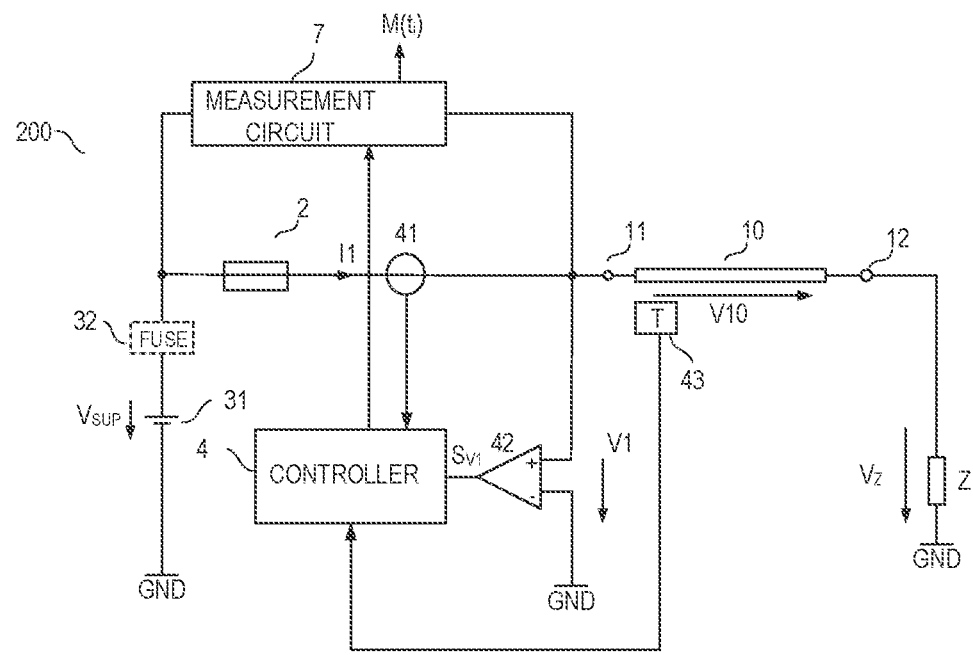
Figure 15:
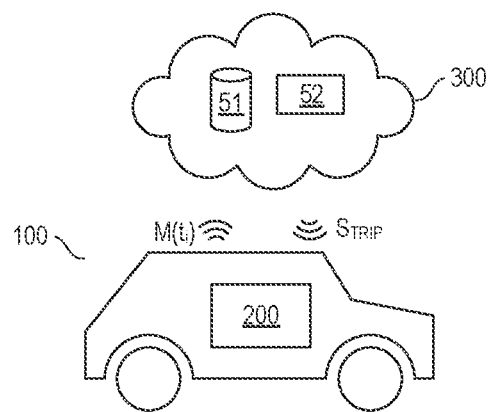
Figure 16:
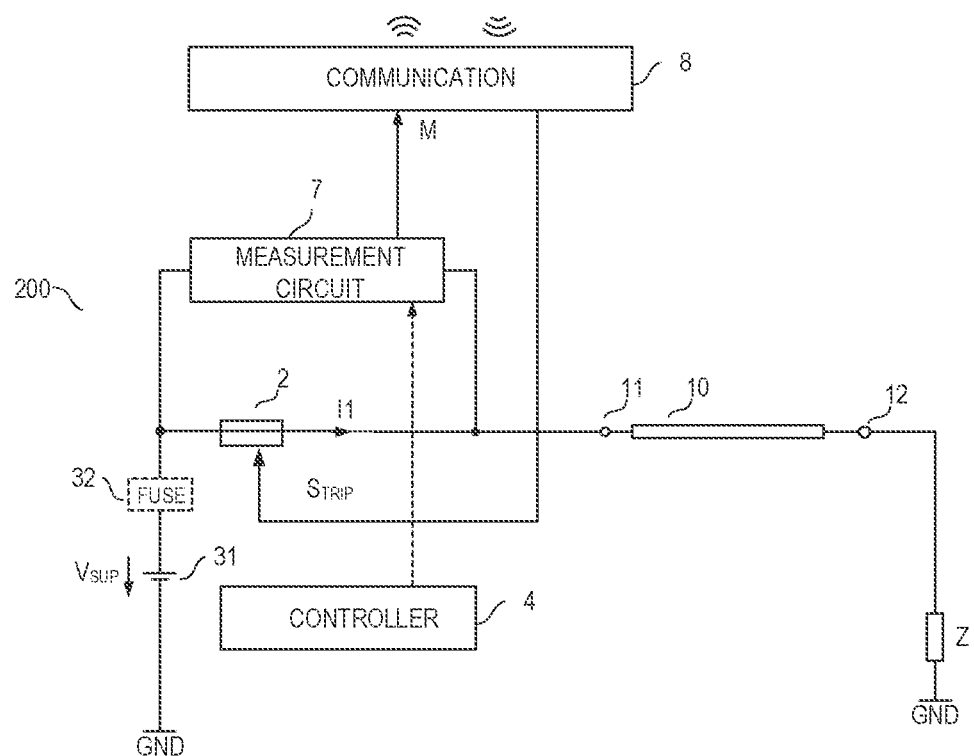
Figure 17:
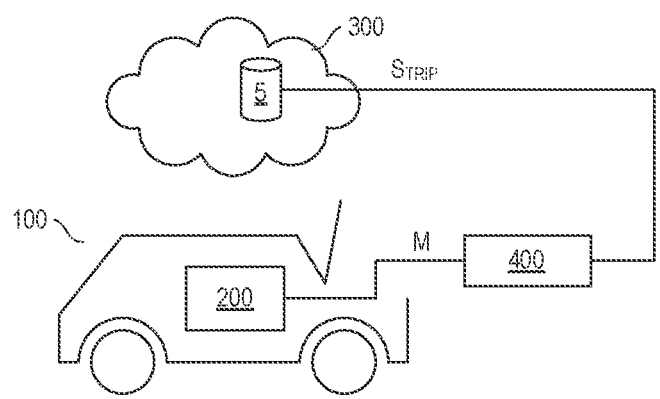
Figure 18:
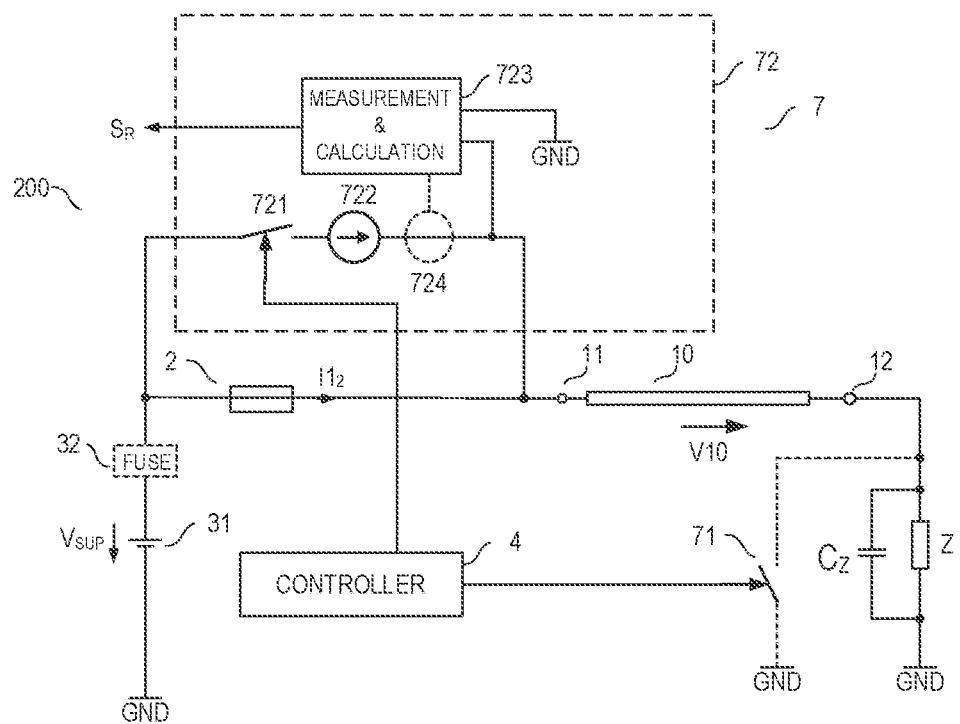
Figure 19:
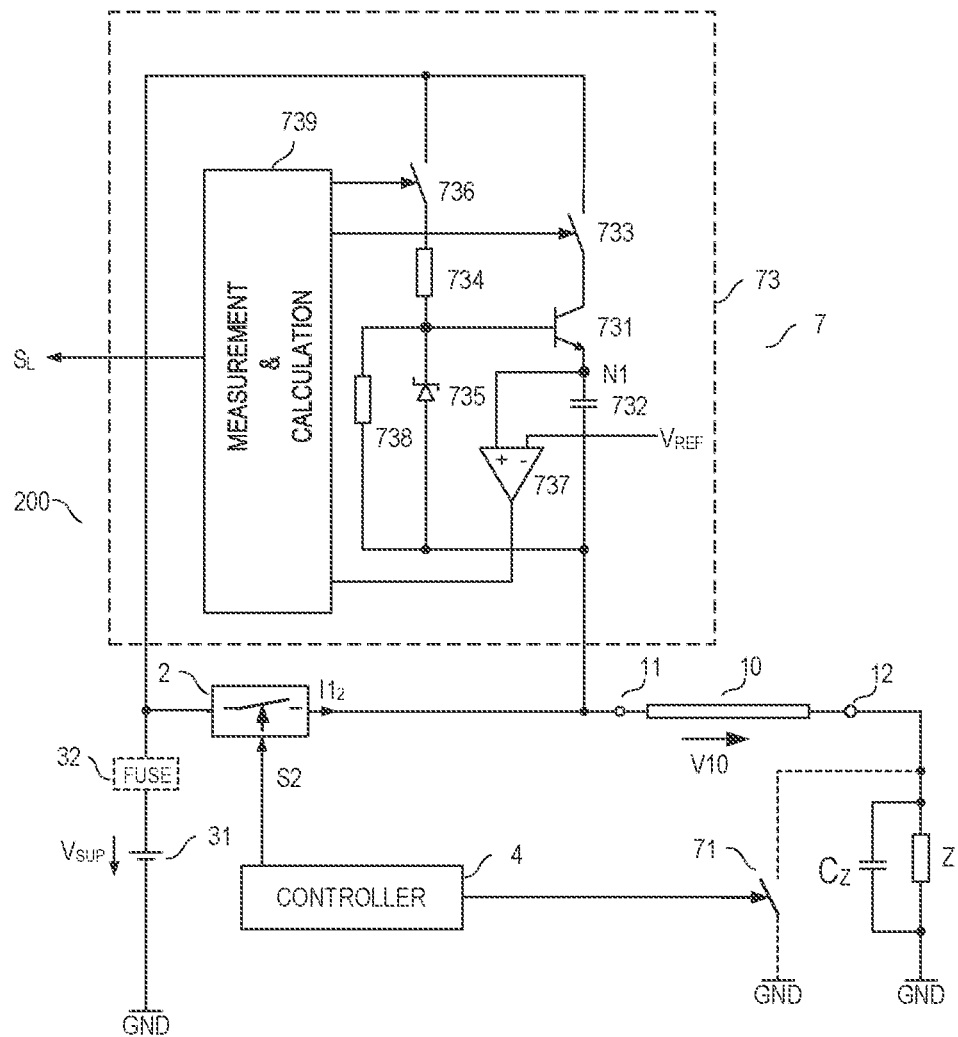
Figure 20:
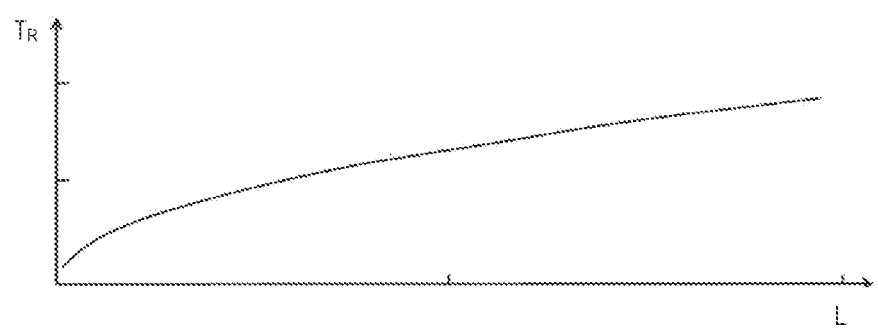
Figure 25:
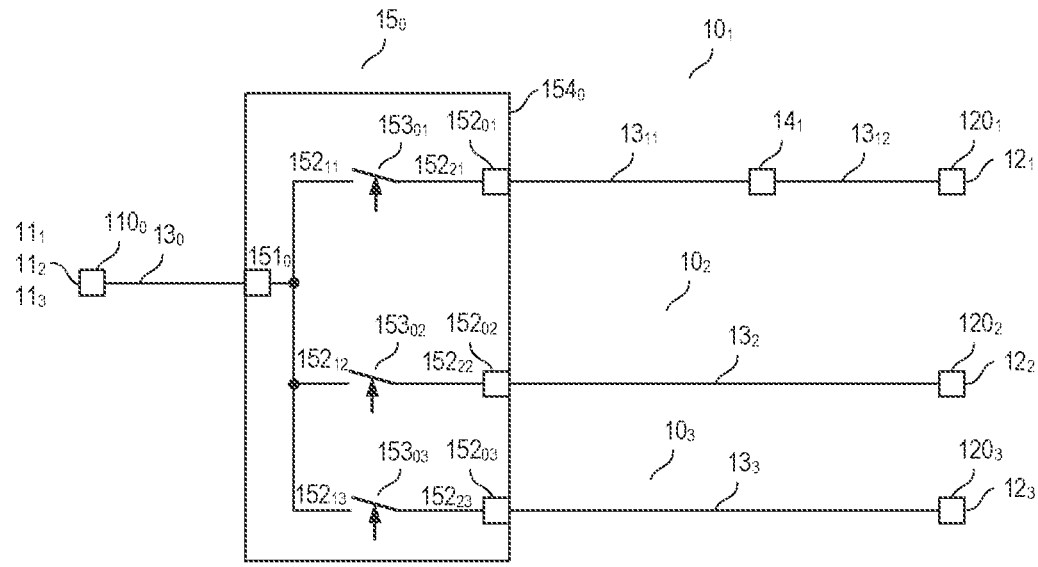

FIG. 5 schematically illustrates one example of a method for checking for the integrity of a wire in a motor vehicle;

FIGS. 6A and 6B schematically illustrate one example of measurement data that include several measurement values of electrical parameters and of comparative data;

FIGS. 7 and 8 illustrate different examples of actions that may be taken when a wire has failed the integrity check;

FIG. 9 illustrates one example of an adjustable wire protector;

FIGS. 10A and 10B illustrate different examples of trip curves that may be implemented in the adjustable wire protector illustrated in FIG. 9;

FIG. 11 illustrates a block diagram of an electrical system that includes a measurement circuit configured to measure one or more electrical parameters of a wire;

FIGS. 12 and 13 illustrate different schemes of measuring at least one electrical parameter of at least one wire;

FIGS. 14A and 14B illustrate different examples of a vehicle electrical system that includes a controller configured to monitor operating conditions of a wire and to cause measuring at least one electrical parameter of the wire dependent on the operating conditions;

FIG. 15 schematically illustrates a motor vehicle including an electrical system and wireless communication interface for communication with a data center that is spaced apart from the vehicle;

FIG. 16 illustrates one example of a vehicle electrical system that includes a wireless communication interface;

FIG. 17 schematically illustrates a motor vehicle that includes a vehicle electrical system with a cable interface;

FIG. 18 illustrates one example of a measurement circuit that is configured to measure a resistance of a cable;

FIG. 19 illustrates one example of a measurement circuit that is configured to measure an inductance of a wire;

FIG. 20 illustrates a possible relationship between an inductance of a wire and a rise time as measured by the measurement circuit illustrated in FIG. 19:

FIGS. 21 to 24 illustrate different examples of a wire in greater detail;

FIG. 25 illustrates one example of a wire harness in greater detail; and

Figure 26:
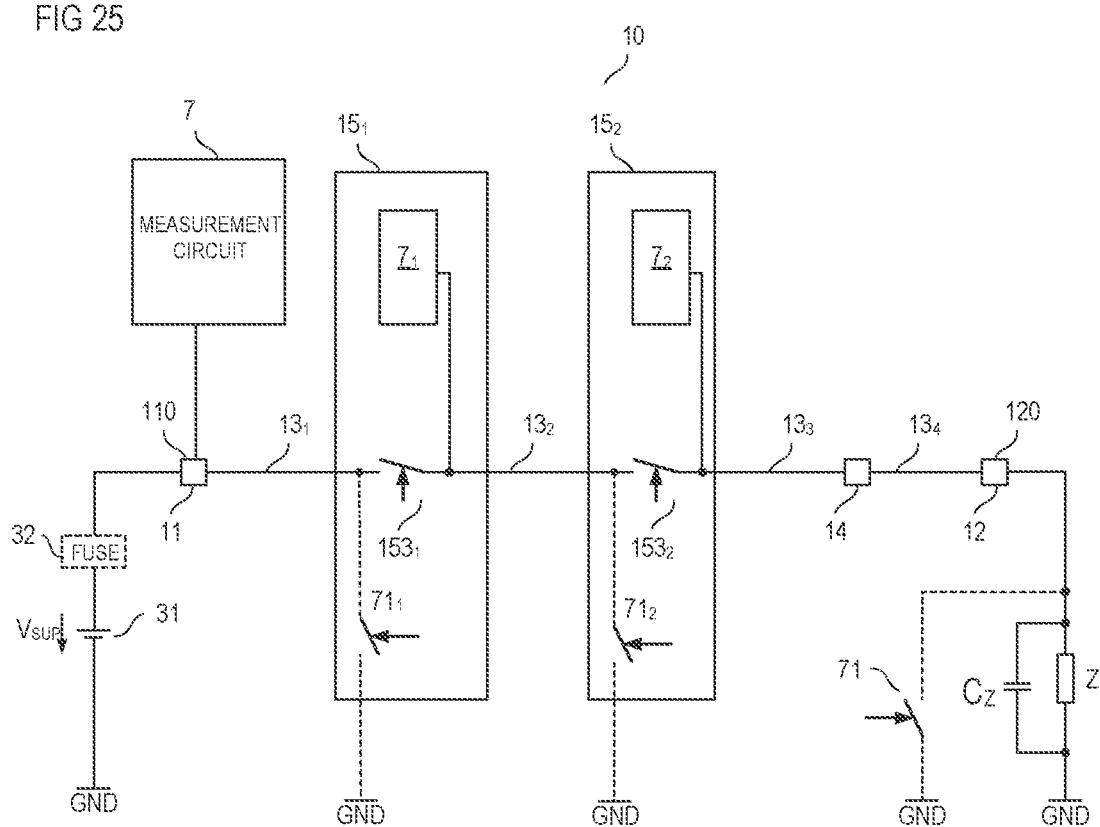

FIG. 26 illustrates one example of an arrangement with a wire harness and several measurement circuits.

In the following detailed description, reference is made to the accompanying drawings. The drawings form a part of the description and for the purpose of illustration show examples of how the invention may be used and implemented. It is to be understood that the features of the various embodiments described herein may be combined with each other, unless specifically noted otherwise.

Figure 1:
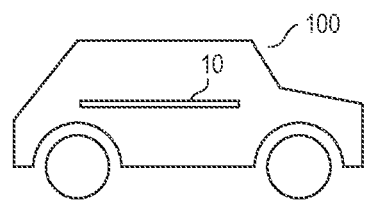

FIG. 1 schematically illustrates a motor vehicle 100 that includes a wire 10. The motor vehicle 100 may by any kind of vehicle that includes at least one of a combustion engine, and an electric engine. The wire 10 may be any kind of wire inside the motor vehicle and is connected between a power source (not illustrated in FIG. 1) and an electrical load (not illustrated in FIG. 1). When the vehicle includes an electrical engine the load is in addition to the electrical engine. The load may include any kind of electrical load included in the car such as loads associated with lighting, heating, communication, navigation, entertainment, seat adjustment, to name only a few.

The wire 10 may be any kind of arrangement that is configured to conduct a current between a first end and a second of the wire. The wire 10 may include at least one conductor and, optionally, connectors at the two ends of the at least one conductor. Examples of the conductor include, but are not restricted to, a cable with an electrically conducting core and an electrically insulating sheathing covering the core, or a trace on a printed circuit board (PCB). The wire 10 may include a single conductor and connectors at opposite ends of the conductor, or may include two or more conductors connected in series. These conductors may be of the same type (e.g., cable or trace on a PCB) or may be of different types. The two or more conductors may be interconnected using passive connectors or using active connectors, such as electronic switches. Examples of a wire including several conductors are explained in detail herein further below.

According to one example, the wire 10 illustrated in FIG. 1 is one of a plurality of wires of a wire harness in a vehicle electrical system. One example of a vehicle electrical system that includes a wire harness with several wires is illustrated in FIG. 2.

Figure 2:
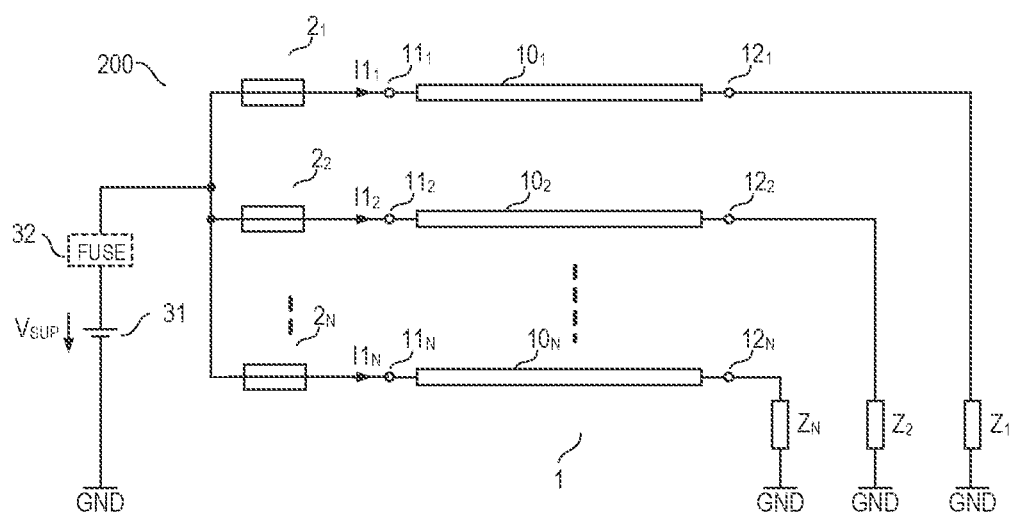

The vehicle electrical system 200 according to FIG. 2 includes the wire harness 1 with a plurality of wires $10_1$-$10_N$. Each of the wires $10_1$-$10_N$ includes a first node $11_1$-$11_N$ (which may also be referred to as first end) and a second node $12_1$-$12_N$ (which may also be referred to as second end) and is connected between a power source 31 and a respective load $Z_1$-$Z_N$. The power source 31 is configured to provide a supply voltage $V_{SUP}$. The power source 31 can be a conventional power source used in a motor vehicle such as, for example, a battery, or a power converter. According to one example, the supply voltage $V_{SUP}$ is a direct voltage. A voltage level of the supply voltage $V_{SUP}$ is 12 V or 48 V, for example.

According to one example, each of the wires $10_1$-$10_N$ of the wire harness 1 is connected between a first node of the supply voltage 31 and a first node of the respective load $Z_1$-$Z_N$, wherein a second node of the power source 31 and second nodes of the loads $Z_1$-$Z_N$ are connected to a common ground GND in the vehicle 100. The common ground may be formed by an electrically conducting chassis (not shown) in the vehicle 100.

Referring to FIG. 2, the vehicle electrical system 200 optionally includes a plurality of wire protectors $2_1$-$2_N$, wherein each of these wire protectors is connected between a respective one of the wires $10_1$-$10_N$ and the power source 31. Each of these wire protectors $2_1$-$2_N$ is configured to interrupt a connection between the power source 31 and the respective wire $10_1$-$10_N$ when an overload condition occurs that may cause the respective wire $10_1$-$10_N$ to be damaged. Each of the wire protectors $2_1$-$2_N$ may include a melting fuse. According to another example, at least one of the wire protectors $2_1$-$2_N$ is an adjustable wire protector that includes a semiconductor switch and operates in accordance with an adjustable trip curve. One example of an adjustable wire protector is explained with reference to FIGS. 9, 10A and 10B in detail herein further below.

The wires $10_1$-$10_N$ may include conventional connectors for connecting the first ends $11_1$-$11_N$ to the power source 31 or the optional wire protectors $2_1$-$2_N$ and for connecting the second ends $12_1$-$12_N$ to the loads $Z_1$-$Z_N$. Such connectors, however, are not illustrated in FIG. 2.

The loads $Z_1$-$Z_N$ are supplied by the power source 31 via the wires $10_1$-$10_N$ of the wire harness 1. The loads $Z_1$-$Z_N$ may include internal switches for switching on or switching off the respective load. Such switches, however, are not illustrated in FIG. 2.

According to another example, a least one switch (not shown) for switching on or switching off a respective one of the loads $Z_1$-$Z_N$ is connected between the battery 31 and the respective wire. In this example the switch and the wire protector connected to the respective wire may be implanted by one electronic device.

Over the time, one or more electrical parameters of the wires $10_1$-$10_N$ may change due to aging. A change of one or more of these parameters may have a negative impact on a proper function. An increase of an electrical resistance of the wire, for example, may result in a higher power dissipation and, therefore, a higher temperature of the wire. The temperature, however, should remain below a predetermined temperature threshold in order to prevent the wire from being damaged. It is therefore desirable, to check for the integrity of at least one of the wires $10_1$-$10_N$ in order to be able to take suitable actions when the at least one wire fails the integrity check. The wire may fail the integrity check when the integrity check reveals that a degradation has occurred. Examples of a method that is suitable for checking for the integrity of one or more wire in a motor vehicle are explained in the following. The examples explained in the following illustrate checking for the integrity of one wire. It goes without saying that the same method may be applied to each of a plurality of wires in the motor vehicle.

In the following, reference number 10 denotes a single wire or an arbitrary one of a plurality of wires in a vehicle electrical systems. This wire 10 may be one of several wires of a wire harness 1 of the type illustrated in FIG. 2. Further, in the following, reference number 2 denotes a wire protector connected to the wire 10, reference numbers 11 and 12 denote first and second ends of the wire 10, and reference character Z denotes a load connected to the wire 10.

Figure 3:
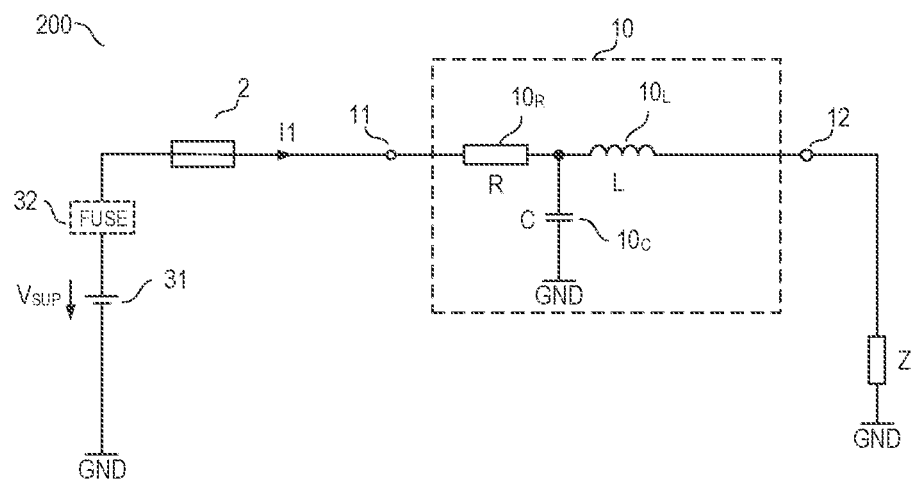
FIG. 3 illustrates a portion of a vehicle electrical system and an equivalent circuit diagram of a wire in greater detail.
Figure 4:
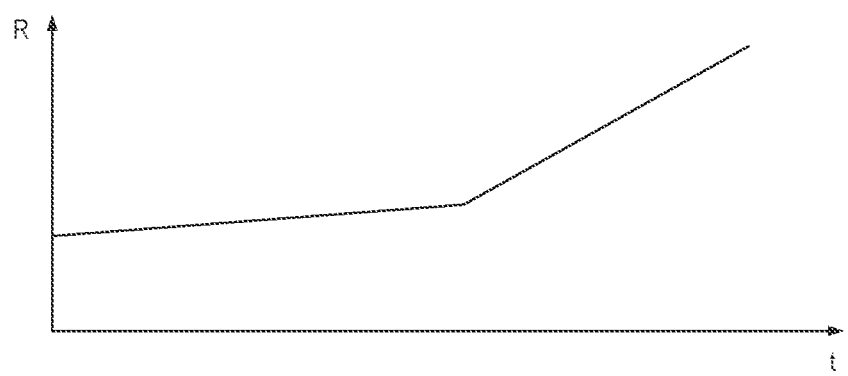
FIG. 4 illustrates one example of an aging effect that may occur in the wire.

FIG. 3 illustrates an equivalent circuit diagram of the wire 10. Referring to FIG. 3, the wire 10 includes a resistance R between the first end 11 and the second end 12, an inductance L between the first end 11 and the second end 12 and a capacitance C between the wire 10 and ground GND. Resistance R and inductance L are represented by a resistor $10_R$ and an inductor $10_L$ in the equivalent circuit diagram shown in FIG. 3, and capacitance C is represented by a capacitor $10_C$ in the equivalent circuit diagram. These electrical parameters, that is, resistance R, inductance L and capacitance C may change over the time due to aging. The resistance R, for example, may increase over the time, as schematically illustrated in FIG. 4.

One example of a method for checking for the integrity of the wire 10 is illustrated in FIG. 5. Referring to FIG. 5, the method includes measuring an electrical parameter of the at least one wire 10 in the motor vehicle 100 at a certain time instance $t_i$ to obtain measurement data $M(t_i)$, wherein the measurement data include at least one measurement value. The method further includes comparing the measurement data $M(t_i)$ with comparative value $K(t_i)$ held in a data storage 5, wherein the comparative data $K(t_i)$ include at least one comparative value. Furthermore, a predefined action is taken based on the result of comparing the measurement data $M(t_i)$ with the comparative data $K(t_i)$.

According to one example, the measurement data $M(t_i)$ represent the resistance R of one wire 10 and a predefined action is taken when the resistance R represented by the measurement data $M(t_i)$ is higher than a resistance threshold represented by the comparative value $K(t_i)$. Examples for suitable actions that may be taken based on comparing the measurement data $M(t_i)$ with the comparative data $K(t_i)$ are explained herein further below.

The measurement data $M(t_i)$ may include at least one measurement value representing at least one electrical parameters of at least one wire. That is, the measurement data may include, for example, (a) only one measurement value that represents only one electrical parameter of only one wire, (b) a plurality of measurement values each representing a respective electrical parameter of several wires, or a plurality of measurement values representing two or more electrical parameter of each of several wires.

FIG. 6A illustrates measurement data $M(t_i)$ that include a plurality of measurement values $R_1(t_i), L_1(t_i), \ldots C_N(t_i)$, wherein these measurement values represent a resistance, an inductances, and a capacitance of each of a plurality of wires. $R_1(t_i)$, for example, is a resistance measurement value associated with a first wire; $L_2(t_i)$, for example, is an inductance measurement value associated with a second wire; and $C_N(t_i)$, for example, is a capacitance measurement value associated with an N-the wire. FIG. 6B illustrates comparative data $K(t_i)$ that may be compared with the measurement data illustrated in FIG. 6A, wherein the comparative data $K(t_i)$ include a plurality of comparative values, wherein each of these comparative values represents a resistance threshold, and inductance threshold, and a capacitance threshold of each of a plurality of wires.

According to one example, comparing the measurement data $M(t_i)$ with the comparative data. $K(t_i)$ includes comparing each measurement value included in the measurement data $M(t_i)$ with a respective one of the comparative values in the comparative data $K(t_i)$. A wire 10 fails the integrity check when at least one of the measurement values included in the measurement data $M(t_i)$ and associated with the wire 10 does not meet a predefined criteria with regard to the associated comparative value. A comparative value associated with a measurement value is that one of the comparative values that is associated with the same wire and the same electrical parameter as the measurement value. A comparative value associated with the resistance measurement value $R_1(t_i)$ of the first wire, for example, is resistance threshold $KR_1(t_i)$ of the first wire, and so on.

That a measurement value does not meet a predefined criteria relative to the respective comparative value may include that the measurement value is higher than the comparative value or is lower than the comparative value. According to one example, the at least one measurement value represents a resistance of a wire and the predefined criteria is that the measurement value is below the comparative value. In this case, the measurement value does not meet the criteria, that is the wire fails the integrity check, when the measurement value is higher than the comparative value.

The comparative data $K(t_i)$ may be obtained in various ways, wherein some methods for obtaining the comparative data are explained in the following. The methods explained in the following relate to obtaining one comparative value $KV(t_i)$, which is referred to as first comparative value in the following, wherein the first comparative value represents an arbitrary one of the comparative values value represented by the comparative data $K(t)$. The first comparative value represents one electrical parameter of one wire, wherein this electrical parameter is referred to as first parameter and the wire is referred to as first wire in the following. The different comparative values represented by the comparative data may be obtained by using the same method or by using different methods. The measurement value with which the first comparative value is compared is referred to as first measurement value in the following.

According to one example, the first comparative value $KV(t_i)$ is dependent on at least one earlier measurement value obtained by measuring the first electrical parameter of the first wire after manufacturing the first wire and before the time instance at which the first measurement value is obtained. The at least one earlier measurement value may include an initial measurement value and/or one or more intermediate measurement values.

The initial measurement value is obtained by measuring the first electrical parameter before a first operation of the vehicle, wherein the initial measurement value may be obtained before installing the first wire in the vehicle or after installing the first wire in the vehicle. In each case, the initial measurement value may be obtained before a first operation of the car.

The first comparative value $KV(t_i)$ may be dependent only on the at least one earlier measurement value. In this case, the first comparative value $KV(t_i)$ may be obtained by multiplying one earlier measurement value with a predefined factor or by multiplying a weighted sum of several earlier measurement values with a predefined factor.

According to another example, the first comparative value is not only dependent on the at least one earlier measurement value but is also dependent on at least one other parameter or measurement value. Other parameters or measurement values include, but are not restricted to (a) a time difference between the time instance of obtaining the initial measurement value and the time instance of obtaining the first measurement value; (b) the mileage of the vehicle; or (c) the average ambient temperature, the maximum ambient temperature or the minimum ambient temperature of the vehicle since the time instance of first operation. In this case, in order to obtain the first comparative value $KV(t_i)$, one earlier measurement value or a weighted sum of several earlier measurement values may be multiplied with a factor that is dependent on at least one of parameters or measurement values (a) to (c).

In addition to the at least one earlier measurement value of the first wire or as an alternative to the at least one earlier measurement value of the first wire the first comparative value $KV(t_i)$ may be dependent on at least one foreign measurement value obtained by measuring a wire corresponding to the first wire in another motor vehicle. The at least one foreign measurement value may be obtained based on only one foreign car or may be based on two or more foreign cars. Further, the at least one foreign measurement value may be an initial foreign measurement value obtained before a first operation of the foreign vehicle or may be an intermediate foreign measurement value obtained after a first operation of the foreign vehicle. The first comparative value may be obtained by calculating a weighted some of several foreign measurement parameters and by multiplying the weighted sum with a factor, wherein this factor may be dependent on at least one of parameters or measurement values (a) to (c) mentioned above.

Referring to FIG. 7, suitable action that may be taken when the at least one wire 10 fails the integrity check include notifying the driver. The driver may be notified in various ways such as, for example, through a display installed in the vehicle, by email, an app installed on the driver's mobile phone, or the like. In cases in which the wire that fails the integrity check is connected to a load which is not highly relevant for the operation of the vehicle the suitable action may include switching off the load.

According to another example illustrated in FIG. 8, the characteristic of an adjustable wire protector is adapted when the at least one wire 10 fails the integrity check. This is explained with reference to FIGS. 9, 10A and 10B in the following.

FIG. 9 schematically illustrates one example of an adjustable wire protector 2. In this example, the wire protector 2 includes an electronic switch 21, a current sensor 22 configured to sense a current I1 through the electronic switch 22, and a protection circuit 23. The protection circuit 23 receives a current measurement signal $S_{I1}$ from the current sensor 22, wherein the current measurement signal $S_{I1}$ represents the current I1 through the electronic switch 21. According to one example, the protection circuit 23 switches off the electronic switch 21 dependent on a current level of the current I1 and the time duration the current I1 flows. More specifically, the protection circuit 23 may operate the switch 21 in accordance with a "trip curve" of the type illustrated in FIG. 10A or 10B. The trip curves illustrated in FIGS. 10A and 10B represent a plurality of current-time pairs, wherein each of these current-time pairs represents a current level of the current I1 (on a logarithmic scale) and an associated time period t (on a logarithmic scale), wherein the time period t associated with a respective current level represents the time period for which the current level is allowed to flow through the electronic switch 21 before the protection circuit 23 switches off the electronic switch 21. As can be seen from FIGS. 10A and 10B, the higher the current I1, the shorter is the time period t for which the current is allowed to flow through the wire 10 before the protection circuit 23 switches off the electronic switch 21.

In the example illustrated in FIG. 10A, a relationship between the time period t and the current I1 is, for example, given by $$t(I1) = -\tau \cdot \ln\left[1 - \frac{(I_0)^2}{I1^2}\right], \qquad (1)$$

wherein $I_0$ represents the current level of a current that is allowed to flow without a time restriction, and $\tau$ is the time constant of the wire 10. $\tau$ and $I_0$ are referred to as trip parameters in the following. According to one example, the protection circuit 23 receives trip data $S_{TRIP}$ that represents the trip parameters $\tau$, $I_0$ and switches off the electronic switch 21 dependent on the current measurement signal $S_{I1}$ and the trip parameters included in the trip data $S_{TRIP}$. The trip data $S_{TRIP}$ define the trip characteristic of the adjustable wire protector 2. According to one example, these trip data are adapted when the at least one wire 10 fails the integrity check. Parameter $I_0$ is reduced, for example, when the integrity check reveals that the wire resistance R has increased over the time.

The trip curve is associated with a certain energy threshold, wherein, at a certain current I1, t(I1) is the time it takes until a certain energy that is equal to the energy threshold has been dissipated in the wire. Basically, the higher the current I1 the shorter the time t(I1) it takes to dissipate the certain energy in the wire. Reducing parameter $I_0$, for example, is equivalent to reducing the energy threshold.

According to another example, the trip data $S_{TRIP}$ further include a maximum current threshold $I_{MAX}$, wherein the protection circuit 23 is configured to immediately switch off the electronic switch 21 when the current I1 reaches the maximum current threshold $I_{MAX}$. The trip curve of the adjustable wire protector 2 in this example is illustrated in FIG. 10B. In this example, in addition to or alternatively to adjusting $I_0$ and $\tau$ adjusting the characteristic of the wire protector 2 may include reducing the maximum current threshold $I_{MAX}$ when the wire 10 fails the integrity check.

Referring to FIG. 11, the vehicle electrical system may include a measurement circuit 7 connected to the wire 10 and configured to obtain the measurement data $M(t_i)$. According to one example, the system further includes a controller 4, wherein the controller 4 is configured to initiate measuring the at least one electrical parameter of the wire 10 in order to obtain the measurement data. Different schemes may be employed by the controller 4 to obtain the measurement data.

According to one example illustrated in FIG. 12, measurement data $M(t_0)$-$M(t_n)$ are regularly obtained that is, for example, every week, every month, every year, or the like. In FIG. 12, measurement data $M(t_0)$-$M(t_n)$ represent measurement data that have been obtained at different time instances $t_0, t_1, \ldots, t_n$.

According to another example illustrated in FIG. 13, the measurement data are obtained dependent on a mileage of the motor vehicle 100 so that each time the motor vehicle has driven a certain amount of kilometers new measurement data are obtained. New measurement data may be obtained every thousand kilometers, every ten thousand kilometers, or the like. In FIG. 13, measurement data $M(t_0)$-$M(t_n)$ represent measurement data that have been obtained at different time instances $t_0, t_1, \ldots, t_n$, wherein each of these time instances $t_0, t_1, \ldots, t_n$ represents a time instance at which a certain amount of kilometers has been completed.

According to another example, the controller 4 is configured to monitor operating conditions of the wire 10 and to initiate obtaining the measurement data $M(t_i)$ whenever a certain operating condition has been detected. In this example, the time instances when the measurement data $M(t_i)$ are obtained are dependent on the operating conditions. According to one example, monitoring the operating conditions includes monitoring at least one of the current I1 through the wire 10, a voltage V10 across the wire 10, and a temperature of the wire 10, wherein obtaining the measurement data is initiated when at least one of the following applies: The current I1 is higher than a predefined current threshold; the voltage V10 is higher than a predefined voltage threshold; the temperature is higher than a predefined temperature threshold; or an energy dissipated in the wire 10 in a predefined time period is higher than a predefined energy threshold, wherein the energy is given by the voltage V10 multiplied with the current I1 and multiplied with the predefined time period. In order to detect the operating conditions, the motor vehicle system includes at least one of a current sensor 41 configured to sense the current I1 through the wire 10, a voltage sensor 42 configured to measure the voltage V10 across the wire 10, and a temperature sensor 43 configured to measure the temperature of the wire 10. The controller 4 receives a respective measurement value from at least one of these sensors 41, 42, 43 and is configured to initiate measuring the at least one wire parameter dependent on sensor signals received from these sensors 41, 42, 43.

Instead of measuring the voltage V10 across the wire 10, as illustrated in FIG. 14A, a voltage V1 across the wire 10 and the load Z may be measured and obtaining the measurement data may be initiated when the voltage V1 is higher than a predefined voltage threshold.

Referring to FIG. 15, the data storage 51 that holds the comparative data $K(t_i)$ is located outside the motor vehicle 100 in a data center 300. For communication between the vehicle electrical system 200 and the data center 300 a wireless communication channel may be established between the motor vehicle 100 and the data center 300, wherein the measurement data $M(t_i)$ are transmitted from the vehicle 100 to the data center 300 via the wireless communication channel.

A comparator 52 that is configured to compare the measurement data $M(t_i)$ received from the vehicle electrical system 200 and the comparative data $K(t_i)$ stored in the data storage 51 may be located in the same data center 300. According to one example, a wireless communication channel is used to transmit adapted trip data $S_{TRIP}$ from the data center 300 to the vehicle electrical system 200 when a wire in the vehicle electrical system 200 fails the integrity check that takes place in the data center 300.

FIG. 16 schematically illustrates a vehicle electrical system 200 that is configured to communicate with the data center 300 through a wireless channel. This vehicle electrical system 200 includes a communication interface 8 that is coupled to the measurement circuit 7 and that is configured to receive the measurement data $M(t_i)$ from the measurement circuit 7 and to transmit the measurement data $M(t_i)$ through a wireless communication channel to the data center 300 that includes the data storage 51. Equivalently, the communication circuit (communication interface) 8 is configured to receive trip data $S_{TRIP}$ from the data center 300 and to forward the received trip data $S_{TRIP}$ to the adjustable wire protector 2.

According to another example illustrated in FIG. 17, the vehicle electrical system 200 includes a cable interface that is configured to be connected to an interface circuit 400 in garage, or the like. The interface circuit 400 is configured to receive the measurement data $M(t_i)$ from the vehicle electrical system and is configured to transmit the measurement data $M(t_i)$ to the data storage 51 in the data center 300. A communication between the interface circuit 400 and the data center 300 may take place via any kind of communication channel such as a wireless communication channel or a cable based communication channel. Equivalently, the interface circuit 4 is configured to receive the trip data $S_{TRIP}$ from the data center 300 and to forward the trip data to the vehicle electrical system 200.

FIG. 18 illustrates one example of the measurement circuit 7. In this example, the measurement circuit 7 includes a resistance measurement circuit 72 that is configured to measure the resistance of the wire 10. The resistance measurement circuit 72 includes a switch 721 that is controlled by the controller 4, a current source 722 connected in series with the switch 721 and a measurement and calculation circuit 723. A series circuit including the switch 721 and the current source 722 is connected between the power source 31 and the wire 10. The measurement and calculation circuit 723 is configured to measure the voltage V1 across the wire 10 and the load Z and is configured to calculate a measurement value R that represents the electrical resistance of the wire 10 based on the voltage V1 and the current 1722 provided by the current source 722. The current source 722 is a fixed current source according to one example, wherein a current level of the current source is either known to the measurement and calculation circuit 23 or the current level is measured by a current sensor 724 coupled to the measurement and calculation circuit. According to one example, the measurement and calculation circuit 723 calculates the resistance R based on the measured voltage V1 and the current 1722 as follows:

$$R = \frac{V1}{I722}. \quad (2)$$

According to one example, the controller 4 is configured to initiate measuring the resistance by closing the switch 721 of the resistance measurement circuit 72 at startup of the vehicle electrical system 200 when a buffer capacitor $C_Z$ connected in parallel with the load Z has not been charged, yet. In this case, the capacitor $C_Z$ (for a short time period) acts like a short circuit between the second node of the wire 12 and ground GND, so that the voltage V1 essentially equals the voltage V10 across the wire 10. Thus, the resistance R calculated in accordance with equation (2) represents the resistance of the wire 10.

Alternatively, the measurement circuit 7 includes a switch 71 connected in parallel with the load Z and, therefore, between the second node 12 of the wire 10 and ground GND. The controller 4 is configured to switch on the switch 71 during measuring the resistance of the wire 10, that is, when the switch 721 connected in series with the current source 722 is switched on.

According to one example, the wire protector 2 is a wire protector of the type illustrated in FIG. 9. In this example, the controller 4 is configured to control operation of this wire protector 2 in such a way that switch 21 of the wire protector is switched off during the measurement procedure.

FIG. 19 illustrates one example of a measurement circuit 7 that includes an inductance measurement circuit 73. This inductance measurement circuit 73 is configured to measure the inductance of the wire 10.

As illustrated in FIG. 19, the inductance measurement circuit 73 includes a transistor 731 (e.g., a BJT transistor), a capacitor 732 coupled between an emitter of the transistor 731 and an output port connected to the first end 11 of the wire 10, a diode 735 (e.g., a Zener diode) coupled between the base of the transistor 731 and the output port, and a resistor 734 coupled between the collector of the transistor 731 and the base of the transistor 731. The load inductance measurement circuit 73 further includes a resistor 738, and comparator 737. In the illustrated example, due to the feedback path provided by the diode 735 (e.g., a Zener diode), the voltage response (measured at the node N1 between the transistor 731 and the capacitor 732) of the load inductance measurement circuit 73 behaves as a non-linear function, and the voltage response is different from a classic RLC second order filter, as will be discussed in more detail hereinafter.

In the arrangement shown in FIG. 19 that includes the wire 10 and the inductance measurement circuit 73 connected to the wire 10 an RLC circuit is formed by electrical components (e.g., transistor 731, diode 735, resistor 734, and capacitor 732) of the load inductance measurement circuit 73 and electrical components (the resistance R and the inductance L, see FIG. 3) of wire 10, In particular, the resistance R and the inductance L of the wire 10 and the capacitor 732 of the inductance measurement circuit 73 provide the resistor, the inductor, and the capacitor of the RLC circuit. Note that due to the feedback of the diode 735 (e.g., a Zener diode), the voltage response at the node N1 is different from that of the classic RLC filter, where the node N1 is a node between the transistor 731 and the capacitor 732. In particular, due to the voltage clamping of the Zener diode (e.g., 735), the voltage response, that is, the voltage at node N1 does not oscillate.

Referring to FIG. 19, the inductance measurement circuit 73 further includes a first switch 733 connected between the transistor 731 and the power source 31, a second switch 736 connected between the resistor 734 and the power source 31, and a measurement and calculation circuit 739. The measurement and calculation circuit 739 controls the first and second switches 733, 736 and receives an output signal from the comparator, wherein the comparator 732 compares the voltage at node N1 with a reference voltage $V_{REF}$.

The measurement and calculation circuit 739 is configured to switch on the first and second switches 733, 736 at a first time instance t1, in order to apply a voltage to the RLC circuit, and to measure a time difference between the first time instance t1 and a second time instance t2, wherein at the second time instance t2 the voltage at node N1 reaches the reference voltage $V_{REF}$. This time difference, which may referred to as rise time $T_R$, is dependent on the inductance L and increases as the load inductance increases. A possible relationship between the inductance L and the rise time $T_R$ is illustrated in FIG. 20. Based on a curve of the type illustrated in FIG. 20 and then measured rise time, the measurement and calculation circuit 739 is configured to obtain the inductance L and output a signal $S_L$ that represents the inductance L.

The at least one wire 10, $10_1$-$10_N$ of the wire harness 1 is only schematically illustrated in the examples explained herein before. Referring to the above, the at least one wire 10, $10_1$-$10_N$ can be implemented in various ways. Some examples for implementing the at least one wire 10, $10_1$-$10_N$ are explained in the following. In these examples, reference number 10 either denotes a single wire or denotes one of several wires of a wire harness 1. The wires of one wire harness 1 can be implemented in the same way. However, it is also possible, that one wire harness 1 includes wires of two or more different wire types. Examples of different wire types are explained in the following.

Figure 21:
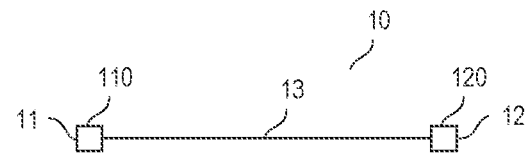

In the example shown in FIG. 21, the wire 10 includes a single conductor 13 between a first connector 110 and a second connector 120. The first connector 110 forms the first end 11 of the wire 10 and serves to connect the wire 10 to the wire protector 2 (not illustrated in FIG. 21). The second connector 120 forms the second end 12 of the wire 10 and serves to connect the wire 10 to a respective load (not illustrated FIG. 20). The conductor 13 provides an electrical connection between the first connector 110 and the second connector 120. The conductor 13 can be any type of electrical conductor, such as, for example, a cable with an electrically conducting core and a sheathing covering the core, a trace on a PCB, or the like.

The connectors 110, 120 can be implemented in various ways, wherein the same type of connector or different types of connector can be used to implement the connectors 110, 120. The connectors 110, 120 may be implemented as releasable connectors or as non-releasable connectors. (i) A releasable connector provides for a releasable connection between the wire 10 and the wire protector 2 or the load Z. A releasable connector may include a male plug and a female plug, for example. (ii) A non-releasable connector provides for a non-releasable connection between the wire 10 and the wire protector 2 or the load Z. Examples of a non-releasable connector include, but are not restricted to, a soldering connection, a welding connection or a crimp-on connection.

Figure 22:
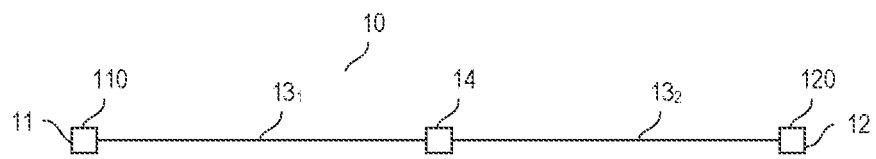

FIG. 22 illustrates a second example of a wire 10. In this example, the wire includes two conductors $13_1$, $13_2$ that are connected in series between the first connector 110 and the second connector 120. The first conductor $13_1$ and the second conductor $13_2$ are connected by a further connector 14. This further connector 14 can be any type of releasable or non-releasable connector of the type explained herein above. According to one example, each of the first conductor $13_1$ and the second conductor $13_2$ is a cable.

The releasable and non-releasable connectors explained before are passive connectors, which are connectors that provide for a permanent electrical connection between the wire 10 and the wire protector 2 or the load Z or between different conductors $13_1$, $13_2$.

Figure 23:
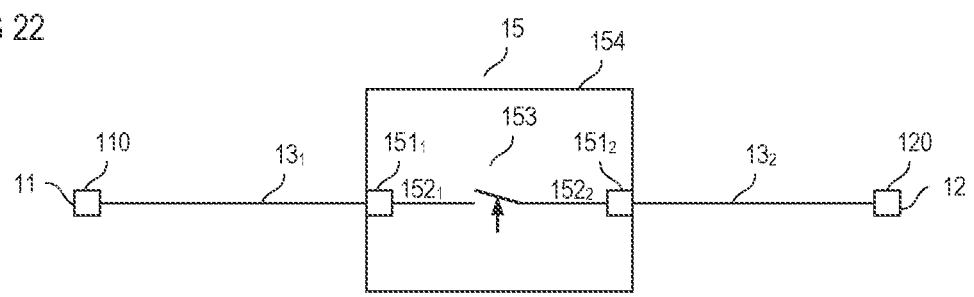

Another type of connector, which may be referred to as active connector 15 is illustrated in FIG. 23. This active connector 15, which connects first and second conductors $13_1$, $13_2$ in the example shown in FIG. 23 includes an electronic switch 153 that is connected between the conductors of a pair of conductors, is controlled by a controller (not shown in FIG. 23), and can be operated in an on-state and an off-state. In the on-state, the switch 153 electrically connects the first conductor $13_1$ and the second conductor $13_2$. In the off-state, the electronic switch 153 interrupts an electrical connection between the first conductor $13_1$ and the second conductor $13_2$. The electronic switch 153 is only schematically illustrated in FIG. 23 and may be implemented in various ways. According to one example, the electronic switch 153 includes a transistor such as, for example, a MOSFET (Metal Oxide Semiconductor Field-Effect Transistor) or an IGBT (Insulated Gate Bipolar Transistor).

According to one example, the electronic switch 153 is arranged on a PCB 154 (which is only schematically illustrated in FIG. 23). Further, the electronic switch 153 is connected to the first conductor $13_1$ via a first trace $152_1$ on the PCB 154 and a first passive connector $151_1$ and to the second conductor $13_2$ via a second trace $152_2$ on the PCB 154 and a second passive connector $151_2$. The first and second passive connectors $151_1$, $151_2$ may be implemented in accordance with any of the examples explained herein before. According to one example, at least one of these passive connectors $151_1$, $151_2$ includes a female plug mounted on the PCB 154 and connected to the respective trace $152_1$, $152_2$ and includes a male plug connected to the respective first or second conductor $13_1$, $13_2$.

Figure 24:
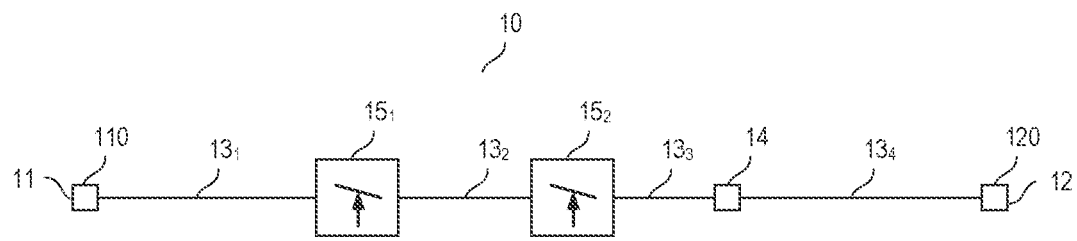

In the examples illustrated in FIGS. 22 and 23, the wire 10 includes two conductors $13_1$, $13_2$ connected by a passive connector 14 or an active connector 15. This, however, is only an example. The wire 10 may include an arbitrary number of different conductors that are connected by active or passive connectors. One example of a wire 10 with more than two conductors is illustrated in FIG. 24. In this example, the wire 10 includes four conductors, a first conductor $13_1$ connected between the first connector 110 and a first intermediate connector $15_1$; a second conductor $13_2$ connected between the first intermediate connector $15_1$ and a second intermediate connector $15_2$; a third conductor $13_3$ connected between the second intermediate connector $15_2$ and a third intermediate connector 14; and a fourth conductor $13_4$ connected between the third intermediate connector 14 and the second connector 120. Just for the purpose of illustration, the first and second intermediate connectors $15_1$, $15_2$ are active connectors in this example, wherein the first intermediate connector $15_1$ includes a first electronic switch and the second intermediate connector $15_2$ includes a second electronic switch. Each of these intermediate connectors $15_1$, $15_2$ may be implemented in the same way as the intermediate connector 15 illustrated in FIG. 23. The third intermediate connector 14 is a passive connector in the example illustrated in FIG. 24.

Each of the wires 10 illustrated in FIGS. 20 to 23 can be tested in accordance with one of the examples explained herein above, wherein in the wires 10 according to FIGS. 21 to 24 the properties of the wire 10 are not only defined by the one or more conductors 13, $13_1$-$13_4$ but also by one or more of the passive and active connectors. Thus, the impedance of the wire 10 result from the of at least one conductor 13, $13_1$-$13_4$ and the at least passive or active connectors 14, 15, $15_1$-$15_2$.

In a wire harness that includes several wires the different wires may be implemented in accordance with any of the examples explained with reference to FIGS. 21 to 24. In this case, each of the different wires has a respective first connector 110 and a respective second connector 120 so that there is only one current path be each first connector 110 and the respective second connector 120. According to another example, two or more wires of a wire harness share the first connector 110 and at least one conductor. This is explained in FIG. 25 which illustrates a wire harness 1 that includes three wires $10_1$, $10_2$, $10_3$. These wires $10_1$-$10_3$ share a first connector $110_0$ so that this first connector $110_0$ forms a first end $11_1$-$11_3$ of each of these wires $10_1$-$10_3$. The three wires $10_1$-$10_3$ further share a first conductor $13_0$ connected between the first connector $110_0$ and an active connector $15_0$. The first conductor $13_0$ is a cable, for example. The active connector $15_0$ includes a first connector $151_0$, which is also referred to as input connector in the following. This input connector $151_0$ is connected to the first conductor $13_0$ and is a passive connector, for example. The active connector $15_0$ further includes three switches $153_{01}$, $153_{02}$, $153_{03}$, wherein each of these switches $153_{01}$-$153_{03}$ is connected between the input connector $151_0$ and a respective one of three output connectors $151_{01}$, $151_{02}$, $151_{03}$. The output connectors $151_{01}$-$151_{03}$ are passive connectors, for example. Each of the three switches $153_{01}$-$153_{03}$ is connected to the input connector $151_0$ via a respective trace $152_{11}$, $152_{12}$, $152_{13}$ on a PCB $154_0$. Further, each of the switches $153_0$-$153_{01}$ is connected the respective output connector $151_{01}$-$153_{03}$ via a respective trace $152_{21}$, $152_{22}$, $152_{23}$ on the PCB. Each of the switches $153_{01}$-$153_{03}$ and the respective output connector $151_{01}$-$151_{03}$ is associated with only one of the wires $10_1$-$10_3$.

Further, each of the wires $10_1$-$10_3$ includes at least one further conductor connected between the respective output connector $151_{01}$-$153_{03}$ and the respective load. $Z_1$-$Z_3$. In the example shown in FIG. 25, the first wire $10_1$ includes two further conductors $13_{11}$-$13_{12}$ that are connected by a passive connector $14_1$ and that are connected in series between the first output connector $152_{01}$ and a second connector $120_1$ of the first wire $10_1$. The second connector $120_1$ forms the second end $12_1$ of the first wire $10_1$.

The second and third wire $10_2$, $10_3$ each include one further conductor $13_2$, $13_3$ connected between the respective output connector $152_{02}$, $152_{03}$ and a respective second connector $120_2$, $120_3$, wherein the second connector $120_2$, $120_3$ forms the second end of the respective wire $10_2$, $10_3$.

In a wire harness of the type illustrated in FIG. 25, the measurement circuit 7 may be connected to the first connector $110_0$ and the power source 31 and may be configured to measure at least one electrical parameter of each of the three wires $10_1$, $10_2$, $10_3$, wherein measuring a respective one of the three wires may include switching on the electronic switch connected between the input connector $151_0$ and the output connector $151_{01}$-$151_{03}$ of the respective wire and switching off the remainder of the electronic switches $153_{01}$-$153_{03}$, that is, switching off the electronic switches connected between the input connector $151_0$ and the output connector $151_{01}$-$151_{03}$ of the wires that are not to be measured.

Referring to the above, one wire 10 may include several wire sections. According to one example, the vehicle electrical system includes several measurement circuits, wherein each of these measurement circuits is configured to measure one or more of these wire sections. One example of an electrical system with a wire 10 having several wire sections 131-134 and with several measurement circuits 7, 71, 72 is illustrated in FIG. 26.

Just for the purpose of illustration, the wire 10 shown in FIG. 26 is of the type illustrated in FIG. 24 and includes two active connectors $15_1$, $15_2$ between wire sections $13_1$, $13_2$ and $13_2$, $13_3$, respectively. In addition to the measurement circuit 7 connected to the first end of the wire 10, the system includes two additional measurement circuits, a first additional measurement circuit 71 connected to a first end of the second wire section $13_2$, and a second additional measurement circuit 72 connected to a first end of the third wire section $13_3$. Each of these additional measurement circuits 71, 72 is connected to a power source, such as the battery 31. However, connections between the additional measurement circuits $7_1$, $7_2$ and the power source are not illustrated in FIG. 26.

Referring to FIG. 26, the additional measurement circuits $7_1$, $7_2$ may be integrated in the active connectors $15_1$, $15_2$. That is, the additional measurement circuits $7_1$, $7_2$ may be arranged on the PCB of a respective active connector or may be integrated in the same semiconductor as the at least one electronic switch $153_1$, $153_2$ of the respective active connector.

Each of the additional measurement circuits $7_1$, $7_2$ is configured to measure at least that wire section at the first end of which it is connected to. Thus, in the example shown in FIG. 26, the first additional measurement circuit $7_1$ is configured to measure at least the second wire section $13_2$, and the second additional measurement circuit $7_2$ is configured to measure at least the third wire section $13_3$. However, it is also possible that each of the additional measurement circuits $7_1$, $7_2$ is configured to measure several wire sections between the load Z and the respective tap it is connected to. The first additional measurement circuit $7_1$, for example, may measure a string including the second, third, and fourth wire sections $13_2$, $13_3$, $13_4$, wherein this kind of measurement may include opening the switch $153_1$ between the string to be measured and the battery, and close each switch $153_2$ inside the string.

Optionally, a respective end of one or more sections is connected to ground GND via a an additional switch $71_1$, $71_2$. In the example illustrated in FIG. 26, a first additional switch $71_1$ is connected between the end of the first wire section $71_1$ and ground GND, and a second additional switch $71_2$ is connected between the end of the second wire section $71_2$ and ground GNU These additional switches make it possible to measure individual wire sections. The first wire section $13_1$, for example, can be measured by measurement circuit 7 when the first additional switch $71_1$ is closed and a connection between the first wire section $13_1$ and the battery 31 is interrupted. The second wire section $13_2$, for example, can be measured by the first additional measurement circuit $7_1$ when the second additional switch $71_2$ is closed and a connection between the second wire section $13_2$ and the battery 31 is interrupted. The additional switches may be integrated in the active connectors $15_1$, $15_2$. Further, the additional switches may be controlled by a controller (not shown) in the same way as bypass switch 71 explained with reference to FIG. 18.

Although the present disclosure is not so limited, the following numbered examples demonstrate one or more aspects of the disclosure.

Example 1. A method, comprising: measuring at least one electrical parameter of at least one wire in a motor vehicle at a certain time instance to obtain measurement data); comparing the measurement data) with comparative data) held in a data storage; and taking a predefined action dependent on the comparing.

Example 2. The method of example 1, wherein the electrical parameter includes at least one of a resistance, an inductance, or a capacitance of the wire.

Example 3. The method of example 1 or 2, wherein the data storage is located outside the motor vehicle and is coupled to the motor vehicle through a wireless communication channel.

Example 4. The method of any one of examples 1 to 3, wherein the certain time instance is a predefined time instance.

Example 5. The method of any one of examples 1 to 3, further comprising: monitoring operation of the wire for the occurrence of a predefined operating condition, wherein the certain time instance is dependent on a time instance at which the predefined operating condition is detected.

Example 6. The method of example 5, wherein the predefined operating condition comprises at least one of the following: a current through the wire is higher than a predefined current threshold; a voltage across the wire is higher than a predefined voltage threshold; or an energy dissipated in the wire in a predefined time period is higher than a predefined energy threshold.

Example 7. The method of any one of the preceding examples, wherein the comparative data) are dependent on at least one of the following: an initial measurement data obtained by measuring the at least one electrical parameter of the wire before a first operation of the motor vehicle; at least one intermediate measurement data obtained by measuring the at least one electrical parameter of the wire after a first operation of the motor vehicle.

Example 8. The method of any one of the preceding examples, wherein the comparative data) are dependent on at least one of the following: an initial foreign measurement data obtained by measuring at least one electrical parameter of at least one other wire of another motor vehicle before a first operation of the other motor vehicle; at least one intermediate foreign measurement data obtained by measuring the at least one electrical parameter of the at least one other wire after a first operation of the other motor vehicle.

Example 9. The method of any one of the preceding examples, wherein the wire is coupled to a power source, wherein the wire is connected in series with an adjustable wire protector, and wherein taking the predefined action comprises adapting a characteristic of the adjustable wire protector.

Example 10. The method of example 9, wherein the adjustable wire protector is configured to disconnect the wire from the power source when a current through the wire reaches a predefined current threshold, and wherein adapting the characteristic of the wire comprises reducing the predefined current threshold.

Example 11. The method of example 10, wherein the adjustable wire protector is configured to disconnect the wire from the power source when energy dissipated in the wire in a predefined time period reaches a predefined energy threshold, and wherein adapting the characteristic of the wire comprises reducing the predefined energy threshold.

Example 12. The method of any one of the preceding examples, wherein the wire is a wire in a wire harness.

Example 13. An arrangement, comprising: a wire with a plurality of conductors; at least one electronic switch connected between a first conductor and a second conductor of a respective pair of the plurality of conductors; and at least one measurement circuit coupled to one of the first and second conductors and configured to measure at least one electrical parameter at least of the one of the first and second conductors.

Example 14. The arrangement of example 13, wherein the at least one electronic switch and the at least one measurement circuit are arranged on the same PCB.

The invention claimed is:

1. A method comprising:
measuring a resistance of a wire in a motor vehicle at a certain time instance to obtain measurement data for the resistance of the wire, wherein the wire is connected in series with an adjustable wire protector configured with a first set of trip data, wherein the wire is coupled to a power source, wherein the adjustable wire protector is further configured to disconnect the wire from the power source when a current through the wire reaches a predefined current threshold, and wherein the predefined current threshold is set to a first current level of the first set of trip data when the adjustable wire protector is configured with the first set of trip data;
comparing the measurement data for the resistance of the wire with comparative value data held in a data storage;
determining whether the wire fails an integrity check based on the comparing of the measurement data for the resistance of the wire with the comparative value data;
determining, in response to a determination that the wire failed the integrity check, a second set of trip data based on the comparing of measurement data for the resistance of the wire; and setting the adjustable wire protector using the second set of trip data, wherein setting the adjustable wire protector using the second set of trip data comprises reducing the predefined current threshold to a second current level of the second set of trip data and wherein the second current level is less than the first current level.

2. The method of claim 1, further comprising measuring an electrical parameter including at least one of an inductance of the wire or a capacitance of the wire.

3. The method of claim 1, wherein the data storage is located outside the motor vehicle and is coupled to the motor vehicle through a wireless communication channel.

4. The method of claim 1, wherein the certain time instance is a predefined time instance.

5. The method of claim 1, further comprising:
monitoring operation of the wire for an occurrence of a predefined operating condition,
wherein the certain time instance is dependent on a time instance at which the predefined operating condition is detected.

6. The method of claim 5, wherein the predefined operating condition comprises at least one of the following:
a current through the wire is higher than a second predefined current threshold;
a voltage across the wire is higher than a predefined voltage threshold; or
an energy dissipated in the wire in a predefined time period is higher than a predefined energy threshold.

7. The method of claim 1, wherein the comparative value data is dependent on at least one of the following:
initial measurement data obtained by measuring the resistance of the wire before a first operation of the motor vehicle; or
at least one intermediate measurement data obtained by measuring the resistance of the wire after the first operation of the motor vehicle.

8. The method of claim 1, wherein the comparative value data is dependent on at least one of the following:
an initial foreign measurement data obtained by measuring a second resistance of at least one other wire of another motor vehicle before a first operation of the other motor vehicle; or
at least one intermediate foreign measurement data obtained by measuring the second resistance of the at least one other wire after the first operation of the other motor vehicle.

9. The method of claim 1,
wherein the adjustable wire protector is configured to disconnect the wire from the power source when energy dissipated in the wire in a predefined time period reaches a predefined energy threshold, and
wherein setting the adjustable wire protector using the second set of trip data comprises reducing the predefined energy threshold using the second set of trip data.

10. The method of claim 1, wherein the wire is arranged in a wire harness.

11. The method of claim 1, further comprising:
measuring an inductance of the wire;
comparing measurement data for the inductance of the wire with a comparative value for the inductance held in the data storage; and
determining that the wire fails the integrity check based on both the comparing of the measurement data for the resistance with the comparative value for the resistance held in the data storage and the comparing of the measurement data for the inductance with the comparative value for the inductance held in the data storage.

12. Adaptable wire protection circuitry comprising:
an adjustable wire protector connected in series with a wire, wherein the adjustable wire protector is configured with a first set of trip data, wherein the wire is coupled to a power source, wherein the adjustable wire protector is further configured to disconnect the wire from the power source when a current through the wire reaches a predefined current threshold, and wherein the predefined current threshold is set to a first current level of the first set of trip data when the adjustable wire protector is configured with the first set of trip data; and
a measurement and calculation circuit configured to:
    measure a resistance of a wire in a motor vehicle at a certain time instance to obtain measurement data for the resistance of the wire;
    compare the measurement data for the resistance of the wire with the comparative value data held in a data storage;
    determine whether the wire fails an integrity check based on the comparison of the measurement data for the resistance of the wire with the comparative value data;
    determine, in response to a determination that the wire failed the integrity check, a second set of trip data based on the comparing of measurement data for the resistance of the wire; and
    set the adjustable wire protector using the second set of trip data, wherein, to set the adjustable wire protector using the second set of trip data, the measurement and calculation circuit is configured to reduce the predefined current threshold to a second current level of the second set of trip data and wherein the second current level is less than the first current level.

13. The adaptable wire protection circuitry of claim 12, wherein the data storage is located outside the motor vehicle and is coupled to the motor vehicle through a wireless communication channel.

14. The adaptable wire protection circuitry of claim 12, wherein the measurement and calculation circuit is further configured to monitor operation of the wire for an occurrence of a predefined operating condition, and wherein the certain time instance is dependent on a time instance at which the predefined operating condition is detected.

15. The adaptable wire protection circuitry of claim 14, wherein the predefined operating condition comprises at least one of:
    a current through the wire is higher than a second predefined current threshold;
    a voltage across the wire is higher than a predefined voltage threshold; or
    an energy dissipated in the wire in a predefined time period is higher than a predefined energy threshold.

16. An adaptable wire protector system comprising:
a wire;
a power source;
an adjustable wire protector configured with a first set of trip data, wherein the adjustable wire protector is further configured to disconnect the wire from the power source when a current through the wire reaches a predefined current threshold, and wherein the predefined current threshold is set to a first current level of the first set of trip data when the adjustable wire protector is configured with the first set of trip data; and
a measurement and calculation circuit configured to:
    compare measurement data for a resistance of the wire with a comparative value data held in a data storage;
    determine whether the wire fails an integrity check based on the comparison of the measurement data for the resistance of the wire with the comparative value data;
    determine, in response to a determination that the wire failed the integrity check, a second set of trip data based on the measurement data for the resistance of the wire; and
    set the adjustable wire protector using the second set of trip data, wherein, to set the adjustable wire protector using the second set of trip data, the measurement and calculation circuit is configured to reduce the predefined current threshold to a second current level of the second set of trip data and wherein the second current level is less than the first current level.

17. The adaptable wire protector system of claim 16, wherein the measurement and calculation circuit is further configured to measure at least one electrical parameter including one or more of an inductance of the wire or a capacitance of the wire.

18. The adaptable wire protector system of claim 16, wherein the adjustable wire protector and the measurement circuit are arranged on the same printed circuit board (PCB).

* * * * *